United States Patent
Zhao et al.

(10) Patent No.: US 10,706,806 B2
(45) Date of Patent: Jul. 7, 2020

(54) PIXEL DRIVING CIRCUIT, ARRAY SUBSTRATE AND DISPLAY DEVICE

(71) Applicants: BEIJING BOE OPTOELECTRONICS TECHNOLOGY CO., LTD., Beijing (CN); BOE TECHNOLOGY GROUP CO., LTD., Beijing (CN)

(72) Inventors: Yu Zhao, Beijing (CN); Yue Li, Beijing (CN); Yanchen Li, Beijing (CN); Jinyu Li, Beijing (CN); Dong Wang, Beijing (CN); Shaojun Hou, Beijing (CN); Mingyang Lv, Beijing (CN); Dawei Feng, Beijing (CN); Wang Guo, Beijing (CN)

(73) Assignees: BEIJING BOE OPTOELECTRONICS TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 7 days.

(21) Appl. No.: 16/322,202

(22) PCT Filed: Apr. 12, 2018

(86) PCT No.: PCT/CN2018/082788
§ 371 (c)(1),
(2) Date: Jan. 31, 2019

(87) PCT Pub. No.: WO2018/210079
PCT Pub. Date: Nov. 22, 2018

(65) Prior Publication Data
US 2019/0189077 A1    Jun. 20, 2019

(30) Foreign Application Priority Data

May 18, 2017    (CN) .......................... 2017 1 0352817

(51) Int. Cl.
*G09G 3/36*        (2006.01)
*H01L 27/12*       (2006.01)
(Continued)

(52) U.S. Cl.
CPC ....... *G09G 3/3688* (2013.01); *G02F 1/13624* (2013.01); *G02F 1/136286* (2013.01);
(Continued)

(58) Field of Classification Search
CPC ......... G09G 3/3233; G09G 2320/0233; G09G 2300/0452; G09G 2320/043; G09G 3/2003; G09G 3/3258
See application file for complete search history.

(56) References Cited

U.S. PATENT DOCUMENTS

2006/0145980 A1*  7/2006  Koma ................... G09G 3/3614
                                                               345/88
2006/0197722 A1*  9/2006  Nakajima ............... H05B 45/20
                                                               345/83
(Continued)

FOREIGN PATENT DOCUMENTS

CN          101452161 A      6/2009

OTHER PUBLICATIONS

Second Office Action and English language translation, CN Application No. 201710352817.9, dated Jul. 10, 2019, 12 pages.

*Primary Examiner* — Gerald Johnson
(74) *Attorney, Agent, or Firm* — Myers Bigel, P.A.

(57) ABSTRACT

A pixel driving circuit includes a pixel unit including a blue sub-pixel connected to a data line to receive a data voltage, and a limit circuit connected between the data line and a reference voltage line configured to transfer a fixed DC voltage, the limit circuit being configured to limit the received data voltage when the received data voltage exceeds a voltage threshold.

20 Claims, 4 Drawing Sheets

(51) Int. Cl.
*G02F 1/1362* (2006.01)
*G09G 3/20* (2006.01)

(52) U.S. Cl.
CPC .............. *G09G 3/20* (2013.01); *G09G 3/3696* (2013.01); *H01L 27/124* (2013.01); *G09G 2300/043* (2013.01); *G09G 2300/0426* (2013.01); *G09G 2300/0452* (2013.01); *G09G 2310/08* (2013.01)

(56) References Cited

U.S. PATENT DOCUMENTS

2010/0103181 A1\* 4/2010 Kawabe ............... G09G 3/3258 345/530
2014/0292821 A1\* 10/2014 Park ..................... G09G 3/3208 345/690

\* cited by examiner

US 10,706,806 B2

PIXEL DRIVING CIRCUIT, ARRAY SUBSTRATE AND DISPLAY DEVICE

CROSS-REFERENCE TO RELATED APPLICATIONS

The present application is a 35 U.S.C. 371 national stage application of PCT International Application No. PCT/CN2018/082788, filed on Apr. 12, 2018, which claims the benefit of Chinese Patent Application No. 201710352817.9, filed on May 18, 2017, the contents of which are incorporated herein by reference in their entireties. The above-referenced PCT International Application was published in the Chinese language as International Publication No. WO 2018/210079 A1 on Nov. 22, 2018.

TECHNICAL FIELD

The present disclosure relates to the field of display technologies, and in particular to a pixel driving circuit, an array substrate, and a display device.

BACKGROUND

In recent years, how to suppress or weaken the blue component in the emission spectrum of a display has attracted the attention of researchers in the display industry. This is because long-term exposure to blue light may cause health problems for the user, including eye pathological hazards such as myopia, cataracts, and macular degeneration, and physical rhythm disturbances.

Currently, mainstream blue light suppression technologies focus on the use of film-like materials to absorb reflected blue light and the use of image processors to adjust image signals. The former requires additional steps of the process, and the latter requires additional hardware and software resources. This can lead to an increase in the production cost.

SUMMARY

According to an aspect of the present disclosure, a pixel driving circuit is provided, comprising: a pixel unit comprising a blue sub-pixel connected to a data line to receive a data voltage; and a limit circuit connected between the data line and a reference voltage line configured to transfer a fixed DC voltage, the limit circuit configured to limit the receive data voltage when the received data voltage exceeds a voltage threshold.

In some embodiments, the reference voltage line is a power supply voltage line via which a power supply supplies a power supply voltage to the pixel unit.

In some embodiments, the pixel unit is a liquid crystal pixel unit comprising a pixel electrode and a common electrode, and the reference voltage line is a common voltage line via which a power supply supplies a common voltage to the common electrode.

In some embodiments, the limit circuit comprises a first transistor having a control electrode connected to the data line, a first electrode connected to the reference voltage line, and a second electrode connected to the data line. The voltage threshold is related to a turn-on voltage of the first transistor and the fixed DC voltage.

In some embodiments, the first transistor is an N-type transistor.

In some embodiments, the first transistor is a P-type transistor.

In some embodiments, the limit circuit further comprises a first capacitor connected between the first electrode of the first transistor and the reference voltage line.

In some embodiments, the first capacitor has such a capacitance that the first capacitor is not fully charged by the data voltage during each data write period in which the data voltage is supplied on the data line.

According to another aspect of the present disclosure, an array substrate is provided, comprising: a plurality of data lines configured to transfer data voltages; a plurality of reference voltage lines configured to transfer a fixed DC voltage; and a plurality of pixel driving circuits arranged in an array, each of the pixel driving circuits comprising: a pixel unit comprising a blue sub-pixel connected to a corresponding one of the data lines to receive a data voltage; and a limit circuit connected between the data line corresponding to the blue sub-pixel corresponding to the one data line to receive the data voltage and a corresponding one of the reference voltage lines, the limit circuit configured to limit the received data voltage when the received data voltage exceeds a voltage threshold.

According to yet another aspect of the present disclosure, a display device is provided, comprising the array substrate as described above.

These and other aspects of the present disclosure will be apparent from and elucidated with reference to the embodiment(s) described hereinafter.

DETAILED DESCRIPTION

It will be understood that, although the terms first, second, third etc. may be used herein to describe various elements, components and/or sections, these elements, components and/or sections should not be limited by these terms. These terms are only used to distinguish one element, component or section from another. Thus, a first element, component or section discussed below could be termed a second element, component or section without departing from the teachings of the present disclosure.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element is referred to as being "connected to", or "coupled to" another element, it can be directly connected or coupled to the other element, or intervening elements may be present. In contrast, when an element is referred to as being "directly connected to" or "directly coupled to" another element, there are no intervening elements present.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Embodiments of the present disclosure will be described in detail below with reference to the accompanying drawings, in order to render more apparent the objectives, technical solutions and advantages of the present disclosure.

Figure 1:
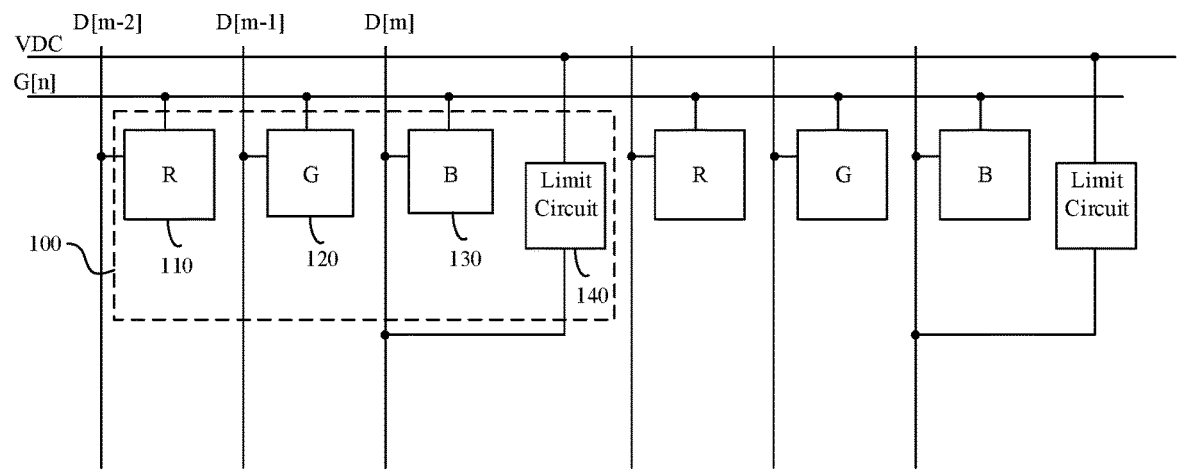
FIG. 1 is a block diagram of a pixel driving circuit in accordance with an embodiment of the present disclosure.

FIG. 1 is a block diagram of a pixel driving circuit 100 in accordance with an embodiment of the present disclosure. Also shown in FIG. 1 is another pixel driving circuit adjacent to the pixel driving circuit 100, and further pixel driving circuits are omitted for clarity of illustration.

The pixel driving circuit 100 includes a pixel unit. In the example of FIG. 1, the pixel unit is shown to include three sub-pixels: a red sub-pixel 110 labeled "R", a green sub-pixel 120 labeled "G", and a blue sub-pixel 130 labeled "B", although the disclosure is not limited thereto. The sub-pixels 110, 120, and 130 are connected to data lines D[m−2], D[m−1] and D[m], respectively, to receive respective data voltages. The sub-pixels 110, 120, and 130 are further connected to a gate line G[n] to receive a gate scan signal. In a data write period synchronized with the gate scan signal, the data lines D[m−2], D[m−1] and D[m] are supplied with respective data voltages, which are then written to the sub-pixels 110, 120, and 130.

The pixel driving circuit 100 further includes a limit circuit 140 connected between the data line D[m] of the blue sub-pixel 130 and a reference voltage line VDC to which a fixed DC voltage is supplied. The limit circuit 140 is configured to limit the data voltage when the data voltage on the data line D[m] exceeds a voltage threshold. This can suppress the intensity of blue light in the output spectrum of the pixel unit, thereby protecting the user from excessive exposure to the blue light. Due to the presence of the limit circuit 140, it is not necessary to provide an additional film material or image processor for the display, thereby saving process steps and costs.

In some embodiments, the reference voltage line VDC may be a power supply voltage line through which a power supply (not shown in FIG. 1) supplies a power supply voltage to the pixel unit. For example, in an organic light emitting diode (OLED) display, the reference voltage line VDC may be a power line connected to the positive or negative terminal of the power supply, depending on the implementation of the OLED pixel circuit. In an embodiment where the pixel unit is a liquid crystal pixel unit including a pixel electrode and a common electrode, the reference voltage line VDC may be a common voltage line through which a power supply supplies a common voltage to the common electrode. In this way, existing voltage signals can be directly utilized without the need for an additional DC power supply, resulting in a more simplified and cost-saving structure.

It will be understood that the phrase "data voltage exceeds voltage threshold" as used herein may have different meanings depending on the implementation of the pixel unit. In the case where the intensity of the light output by the pixel unit is proportional to the magnitude of the data voltage supplied to the pixel unit (for example, a liquid crystal pixel unit or an OLED pixel unit having an N-type driving transistor), the phrase "data voltage exceeds a voltage threshold" means that the data voltage is greater than the voltage threshold. In the case where the intensity of the light output by the pixel unit is inversely proportional to the magnitude of the data voltage supplied to the pixel unit (for example, an OLED pixel unit having a P-type driving transistor), the phrase "data voltage exceeds the voltage threshold" means that the data voltage is less than the voltage threshold. As will be described later, the voltage threshold is related to the circuit parameters of the limit circuit 140 and the fixed DC voltage on the reference voltage line VDC, and thus can be set as needed.

Figure 2:
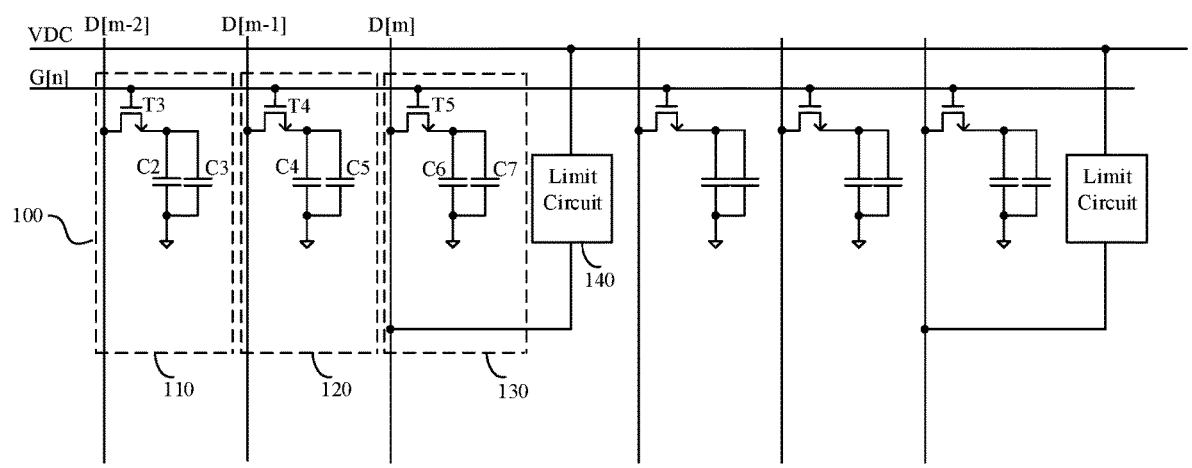
FIG. 2 is a schematic diagram showing the pixel driving circuit of FIG. 1 in an application scenario of a liquid crystal display.

FIG. 2 is a schematic diagram showing the pixel driving circuit 100 of FIG. 1 in an application scenario of a liquid crystal display. As shown in FIG. 2, the red sub-pixel 110 includes a third transistor T3, a first liquid crystal capacitor C2, and a first storage capacitor C3, the green sub-pixel 120 includes a fourth transistor T4, a second liquid crystal capacitor C4, and a second storage capacitor C5, and the blue sub-pixel 130 includes a fifth transistor T5, a third liquid crystal capacitor C6, and a third storage capacitor C7.

The liquid crystal capacitors C2, C4 and C6 have respective pixel electrodes which are connected to respective data lines D[m−2], D[m−1] or D[m] via respective transistors T3, T4 or T5. The liquid crystal capacitors C2, C4, and C6 further have respective common electrodes opposite to their respective pixel electrodes.

The limit circuit 140 is connected between the data line D[m] of the blue sub-pixel 130 and the reference voltage line VDC. As described above, the reference voltage line VDC may be a common voltage line that transfers the common voltage to the common electrodes of the liquid crystal capacitors C2, C4, and C6. The limit circuit 140 limits (specifically, pulls down) the data voltage when the data voltage on the data line D[m] is greater than a voltage threshold.

Although illustration is made here by taking the liquid crystal display device as an example, the pixel driving circuit 100 provided in the embodiment of the present disclosure can also be applied to other types of display devices, such as an organic light emitting diode display, an inorganic electroluminescent display, a plasma display panel (PDP), and the like.

Figure 3:
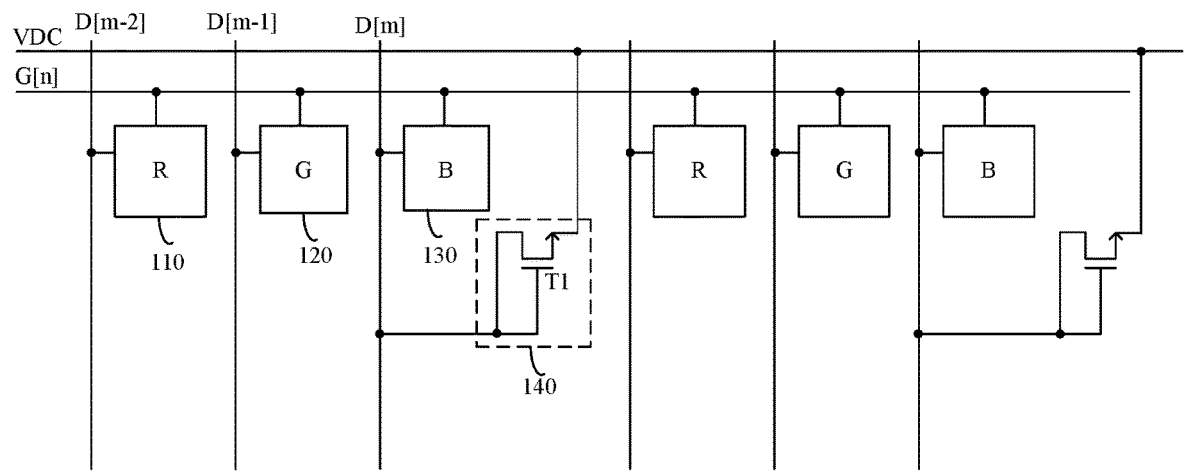
FIG. 3 is a schematic diagram showing an exemplary circuit of a limit circuit in the pixel driving circuit of FIG. 1.

FIG. 3 illustrates an exemplary circuit of the limit circuit 140 in the pixel driving circuit 100 of FIG. 1. As shown in FIG. 3, the limit circuit 140 is connected between the data line D[m] of the blue sub-pixel 130 and the reference voltage line VDC. Specifically, the limit circuit 140 includes a first transistor T1 having a control electrode connected to the data line D[m], a first electrode connected to the reference voltage line VDC, and a second electrode connected to the data line D[m]. In the example of FIG. 3, the first transistor T1 is an N-type transistor. The voltage threshold is related to a turn-on voltage of the first transistor T1 and the fixed DC voltage on the reference voltage line VDC.

Figure 4:
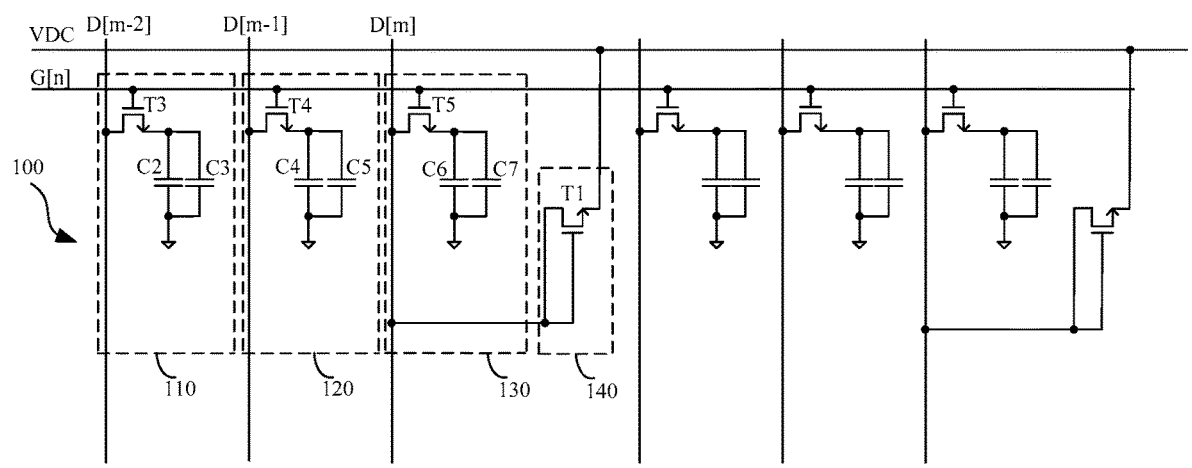
FIG. 4 is a schematic diagram showing the pixel driving circuit of FIG. 3 in an application scenario of a liquid crystal display.

FIG. 4 is a schematic diagram showing the pixel driving circuit 100 of FIG. 3 in an application scenario of a liquid crystal display. As shown in FIG. 4, the red sub-pixel 110 includes a third transistor T3, a first liquid crystal capacitor C2, and a first storage capacitor C3. The green sub-pixel 120 includes a fourth transistor T4, a second liquid crystal capacitor C4, and a second storage capacitor C5, and the blue sub-pixel 130 includes a fifth transistor T5, a third liquid crystal capacitor C6, and a third storage capacitor C7. The first transistor T1 is connected between the data line D[m] of the blue sub-pixel and the reference voltage line VDC. When the difference between the data voltage on the data line D[m] and the fixed DC voltage on the reference voltage line VDC is greater than the turn-on voltage of the first transistor T1, the first transistor T1 is turned on and limits the data voltage on the data line D[m] to be substantially equal to a sum of the fixed DC voltage on the reference voltage line VDC and the turn-on voltage of the first transistor T1. Thus, the data voltage supplied to the blue sub-pixel 130 is limited such that the blue component in the output spectrum of the pixel unit is suppressed.

Figure 5:
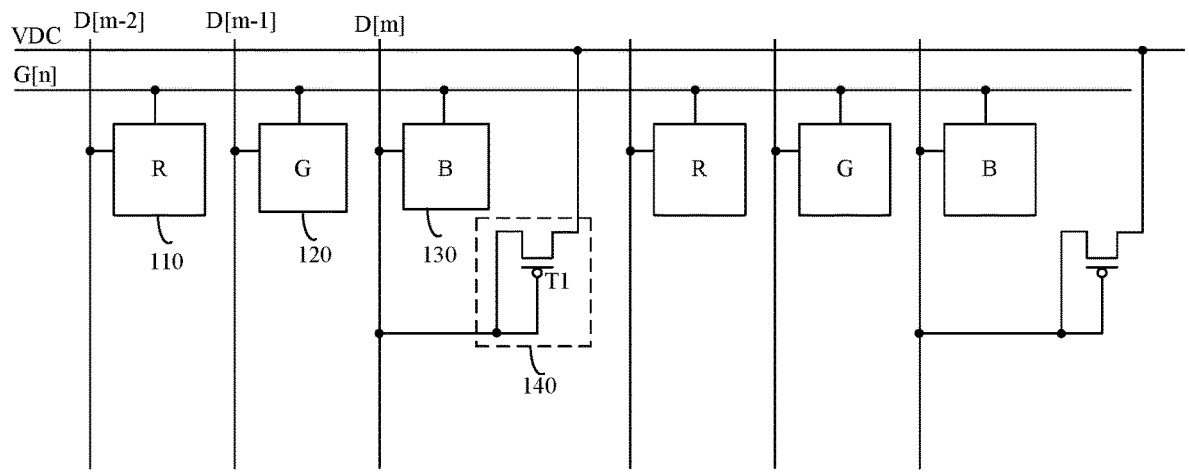
FIG. 5 is a schematic diagram showing a variation of the limit circuit shown in FIG. 3.

FIG. 5 is a schematic diagram showing a variation of the limit circuit 140 shown in FIG. 3. The limit circuit 140 still includes a first transistor T1, and in the example of FIG. 5, the first transistor T1 is a P-type transistor, which typically has a negative turn-on voltage. Such a limit circuit 140 can be applied to a pixel unit in which the intensity of light output by the pixel unit is inversely proportional to the magnitude of the data voltage supplied to the pixel unit, such as an OLED pixel unit having a P-type driving transistor. When the difference between the data voltage on the data line D[m] and the fixed DC voltage on the reference voltage line VDC is less than the turn-on voltage of the first transistor T1, the first transistor T1 is turned on, thereby limiting the data voltage on the data line D[m] to be substantially equal to a sum of the fixed DC voltage on the reference voltage line VDC and the turn-on voltage of the first transistor T1. Thus, the data voltage supplied to the blue sub-pixel 130 is limited such that the blue component in the output spectrum of the pixel unit is suppressed.

Figure 6:
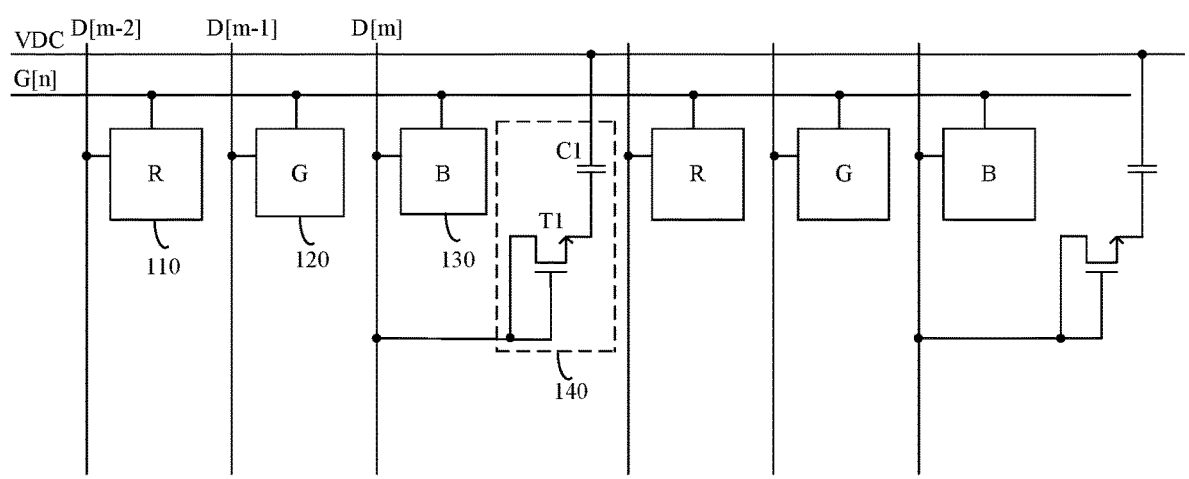
FIG. 6 is a schematic diagram showing another variation of the limit circuit shown in FIG. 3.

FIG. 6 shows another variation of the limit circuit 140 shown in FIG. 3. As shown in FIG. 6, the limit circuit 140 includes a first transistor T1 and a first capacitor C1. The first transistor T1 has a control electrode connected to the data line D[m] of the blue sub-pixel 130, a first electrode connected to one end of the first capacitor C1, and a second electrode connected to the data line D[m]. The first capacitor C1 has a first end connected to a first electrode of the first transistor T1 and a second end connected to the reference voltage line VDC.

In the limit circuit 140 of FIG. 6, when the data voltage on the data line D[m] reaches the voltage threshold, the first transistor T1 is turned on, and the first capacitor C1 is charged by the data voltage on the data line D[m]. This limits the data voltage on the data line D[m] to be substantially equal to a sum of the potential at the first end of the first capacitor C1 and the turn-on voltage of the first transistor T1. In some embodiments, in order to prevent the first transistor T1 from being turned off due to the constant rise of the potential at the first end of the first capacitor C1 during charging, the first capacitor C1 may have such a large capacitance that the first capacitor C1 is not fully charged by the data voltage during each data write period in which the data voltage is supplied on the data line D[m]. Since the capacitance of the first capacitor C1 is large and a single data write period is short, the supply of the data voltage has been stopped before the first capacitor C1 is fully charged, so that the data voltage on the data line D[m] continues to charge the first capacitor C1 for the entire data write period. In this way, the data voltage on the data line D[m] is maintained at a lower potential. At the end of the current data write period, the charge charged in the first capacitor C1 can be drained (e.g., in the form of a leakage current) immediately before the next data write period. Thus, the limit circuit 140 can achieve the limiting of the data voltage in each data write period.

Figure 7:
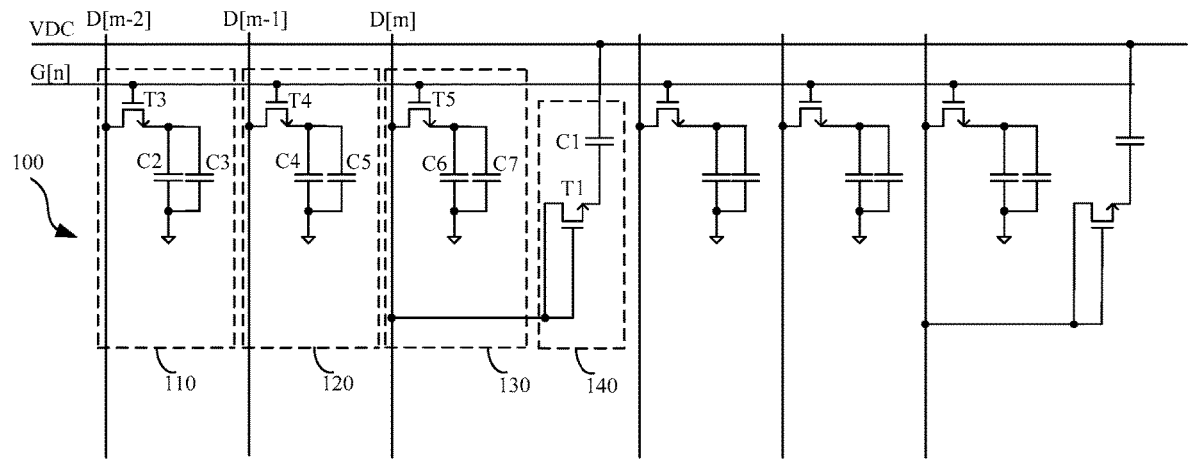
FIG. 7 is a schematic diagram showing the pixel driving circuit of FIG. 6 in an application scenario of a liquid crystal display.

FIG. 7 is a schematic diagram showing the pixel driving circuit of FIG. 6 in an application scenario of a liquid crystal display. As shown in FIG. 7, the red sub-pixel 110 includes a third transistor T3, a first liquid crystal capacitor C2, and a first storage capacitor C3. The green sub-pixel 120 includes a fourth transistor T4, a second liquid crystal capacitor C4, and a second storage capacitor C5. The blue sub-pixel 130 includes a fifth transistor T5, a third liquid crystal capacitor C6, and a third storage capacitor C7. When the data voltage on the data line D[m] of the blue sub-pixel 130 reaches the voltage threshold, the first transistor T1 is turned on, and the first capacitor C1 is charged by the data voltage on the data line D[m]. This limits the data voltage on the data line D[m] to be substantially equal to a sum of the potential at the first end of the first capacitor C1 and the turn-on voltage of the first transistor T1. In this way, the data voltage supplied to the blue sub-pixel 130 is limited such that the blue component in the output spectrum of the pixel unit is suppressed.

Although the liquid crystal display device is taken as an example here, the pixel driving circuit 100 provided in the embodiments of the present disclosure can also be applied to other types of display devices, such as an organic light emitting diode display, an inorganic electroluminescent display, a plasma display panel (PDP), and the like. It will be understood that although the first transistor T1 is shown as an N-type transistor in FIG. 6, it may be a P-type transistor in other embodiments depending on the implementation of the pixel unit.

In the above embodiments, the transistors may be selected from the group consisting of a polysilicon thin film transistor, an amorphous silicon thin film transistor, an oxide thin film transistor, and an organic thin film transistor, although the disclosure is not limited thereto. As used herein, the term "control electrode" refers to the gate or base of a transistor, the term "first electrode" refers to the source or emitter of a transistor, and the term "second electrode" refers to the drain or collector of a transistor. It will be understood that the transistors are typically made symmetric such that their first and second electrodes can be used interchangeably.

Figure 8:
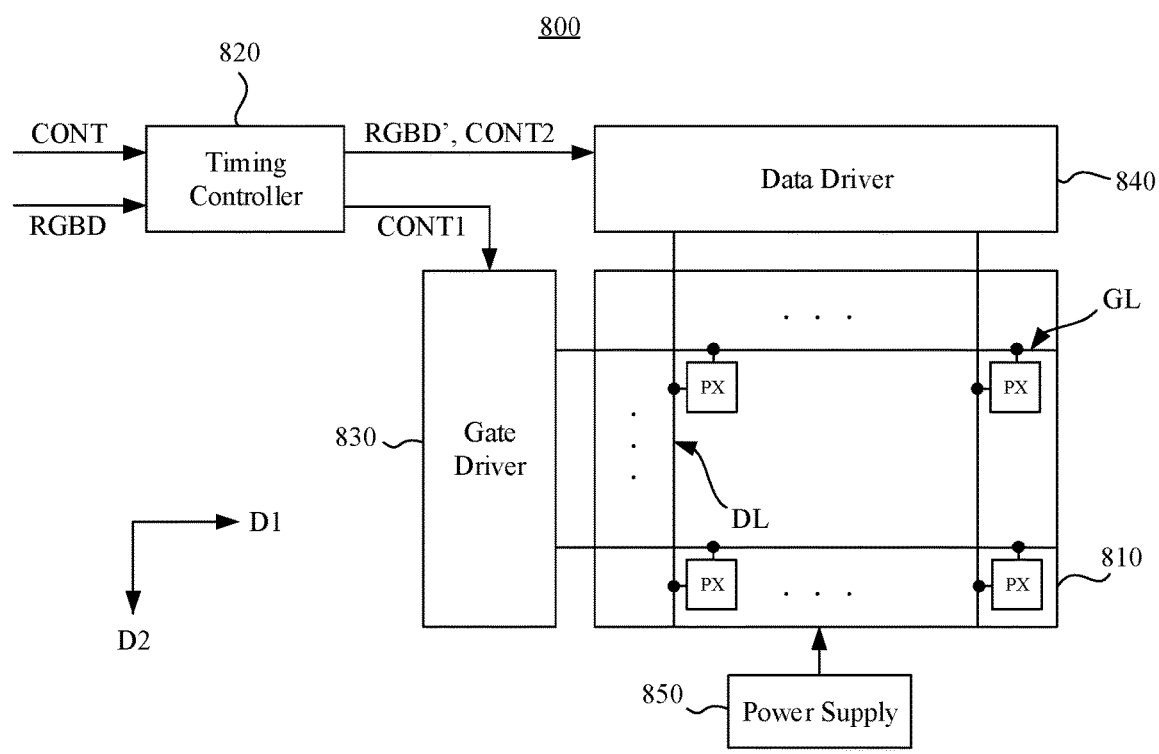
FIG. 8 is a block diagram of a display device in accordance with an embodiment of the present disclosure.

FIG. 8 is a block diagram of a display device 800 in accordance with an embodiment of the present disclosure. Referring to FIG. 8, the display device 800 includes an array substrate 810, a timing controller 820, a gate driver 830, a data driver 840, and a power supply 850.

The array substrate 810 includes a plurality of gate lines GL and a plurality of data lines DL. The gate lines GL extend in a first direction D1, and the data lines DL extend in a second direction D2 that intersects (e.g., is substantially perpendicular to) the first direction D1. The array substrate 810 includes a plurality of pixels PX that are substantially arranged in an array. Each of the pixels PX may be electrically connected to a corresponding one of the gate lines GL and a corresponding one of the data lines DL. Each pixel PX can take the form of the pixel driving circuit 100 as described above.

The timing controller 820 controls the operations of the array substrate 810, the gate driver 830, and the data driver 840. The timing controller 820 receives input image data RGBD and an input control signal CONT from an external device (e.g., a host). The input image data RGBD may include a plurality of input pixel data for the plurality of pixels. Each of the input pixel data may include red grayscale data R, green grayscale data and blue grayscale data B for a corresponding one of the plurality of pixels PX. The input control signal CONT may include a main clock signal, a data enable signal, a vertical sync signal, a horizontal sync signal, etc. The timing controller 820 generates output image data RGBD', a first control signal CONT1, and a second control signal CONT2 based on the input image data RGBD and the input control signal CONT. In some embodiments, the output image data RGBD' may be substantially the same image data as the input image data RGBD. In some embodiments, the output image data RGBD' may be compensated image data generated by compensating the input image data RGBD. The timing controller 820 can generate the first control signal CONT1 based on the input control signal CONT. The first control signal CONT1 may be supplied to the gate driver 830, and the driving timing of the gate driver 830 may be controlled based on the first control signal CONT1. The first control signal CONT1 may include a vertical enable signal, a gate clock signal, etc. The timing controller 820 can generate the second control signal CONT2 based on the input control signal CONT. The second control signal CONT2 may be supplied to the data driver 840, and the driving timing of the data driver 840 may be controlled based on the second control signal CONT2. The second control signal CONT2 may include a horizontal enable signal, a data clock signal, a data load signal, a polarity control signal, etc.

The gate driver 830 receives the first control signal CONT1 from the timing controller 820. The gate driver 830 generates a plurality of gate signals for driving the gate lines GL based on the first control signal CONT1. The gate driver 830 may sequentially apply the plurality of gate signals to the gate lines GL.

The data driver 840 receives the second control signal CONT2 and the output image data RGBD' from the timing controller 820. The data driver 840 generates a plurality of data voltages based on the second control signal CONT2 and the output image data RGBD'. The data driver 840 can apply the plurality of data voltages to the data lines DL. In some exemplary embodiments, the data driver 840 may include a shift register, a latch, a digital to analog converter, and a buffer. The shift register can output a latch pulse to the latch. The latch can temporarily store the output image data RGBD', and can output the output image data RGBD' to the digital-to-analog converter. The digital-to-analog converter can generate analog data voltages based on the output image data RGBD', and can output the analog data voltages to the buffer. The buffer can output the analog data voltages to the data lines DL.

The power supply 850 supplies power to the pixels PX in the array substrate 810. For clarity of illustration, the power supply lines connected to the respective pixels PX are not shown in FIG. 8. In some embodiments, the power supply 850 can also supply power to the timing controller 820, the gate driver 830, and the data driver 840. Examples of the power supply 850 include, but are not limited to, a DC/DC converter and a low dropout regulator (LDO).

In some exemplary embodiments, the gate driver 830 and/or the data driver 840 may be mounted directly (e.g., integrated) in the array substrate 810. Alternatively, the gate driver 830 and/or the data driver 840 may be connected to the array substrate 810 through a Tape Carrier Package (TCP).

It will be understood that the display device 800 can be any product or component having a display function, such as a mobile phone, a tablet computer, a television, a display, a notebook computer, a digital photo frame, a navigator, and the like.

The foregoing is only specific embodiments of the disclosure, and is not intended to be limiting of the disclosure. Various modifications, equivalent substitutions or improvements can be made by a person skilled in the art without departing from the scope of the present disclosure. Thus, such modifications, equivalent substitutions or improvements are intended to be encompassed within the scope of the present disclosure.

What is claimed is:
1. A pixel driving circuit, comprising:
a pixel unit comprising a blue sub-pixel connected to a data line and configured to receive a data voltage; and
a limit circuit connected between the data line and a reference voltage line configured to transfer a fixed DC voltage, wherein the limit circuit is configured to limit the received data voltage in response to the data voltage that was received exceeding a voltage threshold.
2. The pixel driving circuit of claim 1, wherein the reference voltage line comprises a power supply voltage line via which a power supply supplies a power supply voltage to the pixel unit.
3. The pixel driving circuit of claim 1,
wherein the pixel unit comprises a liquid crystal pixel unit comprising a pixel electrode and a common electrode, and
wherein the reference voltage line comprises a common voltage line via which a power supply supplies a common voltage to the common electrode.
4. The pixel driving circuit of claim 1,
wherein the limit circuit comprises a first transistor having a control electrode connected to the data line, a first electrode connected to the reference voltage line, and a second electrode connected to the data line, and
wherein the voltage threshold is related to a turn-on voltage of the first transistor and the fixed DC voltage.
5. The pixel driving circuit of claim 4, wherein the first transistor comprises an N-type transistor.
6. The pixel driving circuit of claim 4, wherein the first transistor comprises is a P-type transistor.
7. The pixel driving circuit of claim 4,
wherein the limit circuit further comprises a first capacitor connected between the first electrode of the first transistor and the reference voltage line.
8. The pixel driving circuit of claim 7,
wherein the first capacitor has a capacitance for which the first capacitor is not fully charged by the data voltage during data write periods in which the data voltage is supplied on the data line.
9. An array substrate, comprising:
a plurality of data lines configured to transfer data voltages;
a plurality of reference voltage lines configured to transfer a fixed DC voltage; and
a plurality of pixel driving circuits arranged in an array, each of the pixel driving circuits comprising:

a pixel unit comprising a blue sub-pixel connected to a corresponding one of the data lines and configured to receive a data voltage; and a limit circuit connected between the corresponding one of the data lines and a corresponding one of the reference voltage lines, wherein the limit circuit is configured to limit the data voltage that was received in response to the data voltage that was received exceeding a voltage threshold.

10. The array substrate of claim 9, wherein each of the reference voltage lines comprises a power supply voltage line via which a power supply supplies a power supply voltage to the pixel unit.

11. The array substrate of claim 9, wherein the pixel unit comprises a liquid crystal pixel unit comprising a pixel electrode and a common electrode, and wherein each of the reference voltage lines comprises a common voltage line via which a power supply supplies a common voltage to the common electrode.

12. The array substrate of claim 9, wherein the limit circuit comprises a first transistor having a control electrode connected to the corresponding data line, a first electrode connected to the corresponding reference voltage line, and a second electrode connected to the corresponding data line, and wherein the voltage threshold is related to a turn-on voltage of the first transistor and the fixed DC voltage.

13. The array substrate of claim 12, wherein the first transistor comprises an N-type transistor.

14. The array substrate of claim 12, wherein the first transistor comprises a P-type transistor.

15. The array substrate of claim 12, wherein the limit circuit further comprises a first capacitor connected between the first electrode of the first transistor and the corresponding one of the reference voltage lines.

16. The array substrate of claim 15, wherein the first capacitor has a capacitance for which the first capacitor is not fully charged by the data voltage during data write periods in which the data voltage is supplied on the corresponding one of the data lines.

17. A display device comprising the array substrate of claim 9.

18. A display device comprising the array substrate of claim 10.

19. A display device comprising the array substrate of claim 11.

20. A display device comprising the array substrate of claim 12.

* * * * *